(12) United States Patent
Zemen et al.

(10) Patent No.: US 11,698,420 B2
(45) Date of Patent: Jul. 11, 2023

(54) MAGNETIC SENSOR INCLUDING A MULTILAYER STRUCTURE COMPRISING A PIEZOMAGNETIC COMPONENT, A MAGNETOSTRICTIVE COMPONENT AND A PIEZOELECTRIC COMPONENT

(71) Applicant: LoMaRe Chip Technology Changzhou Co., Ltd., Changzhou (CN)

(72) Inventors: Jan Zemen, Klatovy (CZ); Andrei Paul Mihai, Brasov (RO); Bin Zou, Zhangzhou (CN)

(73) Assignee: LoMaRe Chip Technology Changzhou Co., Ltd., Changzhou (CN)

( * ) Notice: Subject to any disclaimer, the term of this patent is extended or adjusted under 35 U.S.C. 154(b) by 0 days.

(21) Appl. No.: 17/690,069

(22) Filed: Mar. 9, 2022

(65) Prior Publication Data

US 2022/0291298 A1 Sep. 15, 2022

(30) Foreign Application Priority Data

Mar. 10, 2021 (CN) .......................... 202110258962.7

(51) Int. Cl.
  *G01R 33/02* (2006.01)
  *H10N 35/85* (2023.01)
  *H10N 35/00* (2023.01)

(52) U.S. Cl.
  CPC ........... *G01R 33/02* (2013.01); *H10N 35/101* (2023.02); *H10N 35/85* (2023.02)

(58) Field of Classification Search
  None
  See application file for complete search history.

(56) References Cited

U.S. PATENT DOCUMENTS

| 6,809,515 B1* | 10/2004 | Li ........................ G01R 33/18 324/244 |
| 2012/0098530 A1* | 4/2012 | Saito .................... H10N 35/101 324/209 |
| 2019/0325932 A1* | 10/2019 | Manipatruni .......... H10N 50/00 |

FOREIGN PATENT DOCUMENTS

| CN | 102520372 B | 4/2014 |
| CN | 103744036 A | 4/2014 |

(Continued)

*Primary Examiner* — Douglas X Rodriguez
(74) *Attorney, Agent, or Firm* — Snyder, Clark, Lesch & Chung, LLP

(57) ABSTRACT

A magnetic sensor includes a piezomagnetic component which includes a first piezomagnetic element and a second piezomagnetic element that are arranged opposite to each other, a magnetostrictive component which includes a first magnetostrictive element and a second magnetostrictive element arranged opposite to each other on the same side of the first piezomagnetic element and the second piezomagnetic element, respectively, and a piezoelectric component which includes a first piezoelectric element deposited underneath the first piezomagnetic element, a second piezoelectric element deposited underneath the second piezomagnetic element, a third piezoelectric element deposited underneath the first magnetostrictive element, and a fourth piezoelectric element deposited underneath the second magnetostrictive element. The first piezoelectric element and the second piezoelectric element are electrically connected to a power supply circuit, and produce first deformation, which is applied to the first piezomagnetic element and the second piezomagnetic element to produce an alternating magnetic field.

10 Claims, 10 Drawing Sheets

(56) References Cited

FOREIGN PATENT DOCUMENTS

| | | |
|---|---|---|
| CN | 103105591 B | 10/2014 |
| CN | 204495981 U | 7/2015 |
| CN | 106449971 A | 2/2017 |
| CN | 104198963 B | 5/2017 |
| CN | 108241130 A | 7/2018 |
| CN | 110389308 A | 10/2019 |
| CN | 110794345 A | 2/2020 |
| CN | 211263738 U | 8/2020 |
| CN | 111896896 A | 11/2020 |
| DE | 102014204661 A1 | 9/2015 |
| WO | 2012126693 A1 | 9/2012 |

\* cited by examiner

MAGNETIC SENSOR INCLUDING A MULTILAYER STRUCTURE COMPRISING A PIEZOMAGNETIC COMPONENT, A MAGNETOSTRICTIVE COMPONENT AND A PIEZOELECTRIC COMPONENT

FIELD OF THE INVENTION

The present invention relates to the technical field of sensors, in particular to a magnetic sensor.

BACKGROUND OF THE INVENTION

The progress of modernization has depended on sensor technologies acting as an important art, which has undergone an evolution from a crude sensor to a high-precision sensor, an expensive sensor to a popular sensor, therefore the evolution to cheap, high-precision, and low-power consumption sensors has become a megatrend as for the current sensor development.

Magnetic sensors are one of sensor categories, acting as an increasingly important role in the development of modern science and technology, also used more and more widely due to their reliability and flexibility. According to their type, magnetic sensors can be sorted as: Search coil type, Hall effect type, Magnetoresistance type (AMR or GMR), Magnetic tunnel type (MTJ or SDJ), Magneto-optical type, Optically pumped type, Magneto-diode type, Magneto-transistor type, Nuclear Precession type, Fluxgate type, Magnetoelectric type, Superconducting quantum interference devices type (SQUID), etc.

The current magnetoelectric sensors produce magnetoelectric effect mainly by stacking and recombining magnetostrictive materials and piezoelectric materials. Its working principle is that when a magnetic field acts on a magnetoelectric sensor, where the magnetostrictive material produces deformation, which is transferred to the piezoelectric material through the coupling of interface force, so that the deformation occurs on the piezoelectric material, whose positive piezoelectric effect makes electric charges output, thus realizing the conversion from magnetism to electricity.

Due to structural limitations, the existing magnetoelectric sensors have a fairly weak capability to detect the environments with low magnetic field intensity, and are therefore limited in the respect of usage scenarios.

SUMMARY OF THE INVENTION

In order to overcome the above technical defects, the objective of the present invention is to provide a magnetic sensor that can be applied to a magnetic field with its intensity as low as about 10 pT, and expand its usage scenarios such as drawing magnetocardiograms or magnetoencephalograms.

The present invention discloses a magnetic sensor used to detect a measured magnetic field $H_{DC}$, comprising: a piezomagnetic component, a magnetostrictive component, and a piezoelectric component, wherein the piezomagnetic component includes a first piezomagnetic element and a second piezomagnetic element that are arranged opposite to each other, the magnetostrictive component includes a first magnetostrictive element and a second magnetostrictive element that are arranged opposite to each other on the same side or normal side of the first piezomagnetic element and the second piezomagnetic element, respectively, the piezoelectric component includes a first piezoelectric element deposited underneath the first piezomagnetic element, a second piezoelectric element deposited underneath the second piezomagnetic element, a third piezoelectric element deposited underneath the first magnetostrictive element, and a fourth piezoelectric element deposited underneath the second magnetostrictive element; wherein the first piezoelectric element and the second piezoelectric element are electrically connected to a power supply circuit, and produce first deformation, the first deformation is applied to the first piezomagnetic element and the second piezomagnetic element to produce an alternating magnetic field $H_{AC}$, the alternating magnetic field $H_{AC}$ is stacked to the measured magnetic field $H_{DC}$ to form a magnetic circuit, so that the first magnetostrictive element produces second deformation, and the second magnetostrictive element produces third deformation, the second deformation and the third deformation produce a first electric potential and a second electric potential on the third piezoelectric element and the fourth piezoelectric element, respectively, and the magnetic sensor calculates the magnetic field intensity of the measured magnetic field $H_{DC}$ based on the first electric potential and the second electric potential.

Preferably, the first magnetostrictive element and the second magnetostrictive element are arranged on the normal side of the first piezomagnetic element and the second piezomagnetic element, respectively, to form a rectangular magnetic induction layer, the first magnetostrictive element, the second magnetostrictive element, the first piezomagnetic element and the second piezomagnetic element are arranged on an identical horizontal layer.

Preferably, the first magnetostrictive element and the second magnetostrictive element are arranged on the same side of the first piezomagnetic element and the second piezomagnetic element, respectively, to form a magnetic induction strip, and the first magnetostrictive element is arranged on the first piezomagnetic element and the second magnetostrictive element is arranged on the second piezomagnetic element.

Preferably, the first magnetostrictive element and the second magnetostrictive element are arranged on the same side of the first piezomagnetic element and the second piezomagnetic element, respectively, to form a magnetic induction strip, and the first magnetostrictive element is arranged beside the both ends of the first piezomagnetic element and the second magnetostrictive element is arranged beside the both ends of the second piezomagnetic element.

Preferably, at least two magnetic induction strips are arranged side by side to form a sensor array, and each magnetic induction strip is distributed in parallel.

Preferably, the magnetic sensor further includes a magnetic conductor element, the magnetic conductor element is arranged on the both ends of the first magnetostrictive element and the second magnetostrictive element to increase the magnetic field magnification on the side of the magnetostrictive component, when the magnetic sensor has a rectangular magnetic induction layer, the magnetic conductor element extends to be connected to both ends of the first piezomagnetic element and the second piezomagnetic element, so as to maintain the rectangular magnetic induction layer; when the magnetic sensor has a magnetic induction strip, the magnetic conductor element extends to be connected to the two ends of the first piezomagnetic element and the second piezomagnetic element, or extends to form the end of the magnetic sensor, so as to maintain a magnetic connection between the piezomagnetic component and the magnetostrictive component.

Preferably, the magnetic conductor element is made of a magnetic alloy including one or more of Fe, Co, Ni, Si, and B, the magnetic conductor element has a magnetoconductivity of at least 1,000.

Preferably, the magnetic sensor further includes an insulating element and a conducting element, the insulating elements are alternately arranged between the first piezoelectric element, the second piezoelectric element, the third piezoelectric element, and the fourth piezoelectric element, the conducting element is deposited underneath the piezoelectric component.

Preferably, the magnetostrictive component is made from any one of Fe-based amorphous (FeSiB), Galfenol alloy, FeCo or Terfenol-D, the piezomagnetic components is made from $Mn_{3-x}A_xB_{1-y}C_yN_{1-z}$ where A, B and C include one or more of Ag, Al, Au, Co, Cu, Fe, Ga, Ge, In, Ir, Ni, Pd, Pt, Rh, Sb, Si, Sn, Zn, or made from $Cr_{3-x}A_xSn_{1-y}B_yN_{1-z}$ where A and B include one or more of As, Ga, Ge, In, Sn, Mn, Ir, Pd, Pt, Rh, the piezoelectric component is made from any one of $BaTiO_3$, $Pb(Zr_xTi_{1-x})O_3$, $(1-x)[Pb(Mg_{1/3}Nb_{2/3})O_3]$-x $[PbTiO_3]$, AlN, ZnO, Li and/or Be-doped ZnO, $Ba_xSr_{1-x}TiO_3$, $BaZr_xTi_{1-x}O_3$, $Bi_4Ti_3O_{12}$ and $LaWN_3$.

Preferably, the lattice mismatch between the piezomagnetic component and the piezoelectric component ranges between −1% and +1%, the strain of the magnetostrictive component ranges between 1 ppm and 2000 ppm, the length-to-width ratio of the magnetic sensor ranges between 1:1-1:2000.

After we have adopted the above-mentioned technical solution, compared with the prior art, the present invention has the following beneficial effects:
1. An offset field used for magnetostrictive materials is not required in usage scenarios, and an alternating magnetic field $H_{AC}$ has been induced through piezomagnetic effect to be capable of giving a microscopic low-power sensor without making a pair of macro coils for driving the $H_{AC}$.
2. When a magnetic circuit is disconnected, magnetic field measurement sensitivity can still be keep in a sensitive state, which makes it easier to integrate into the array or into the field to be measured with different lengths.

Figure 1:
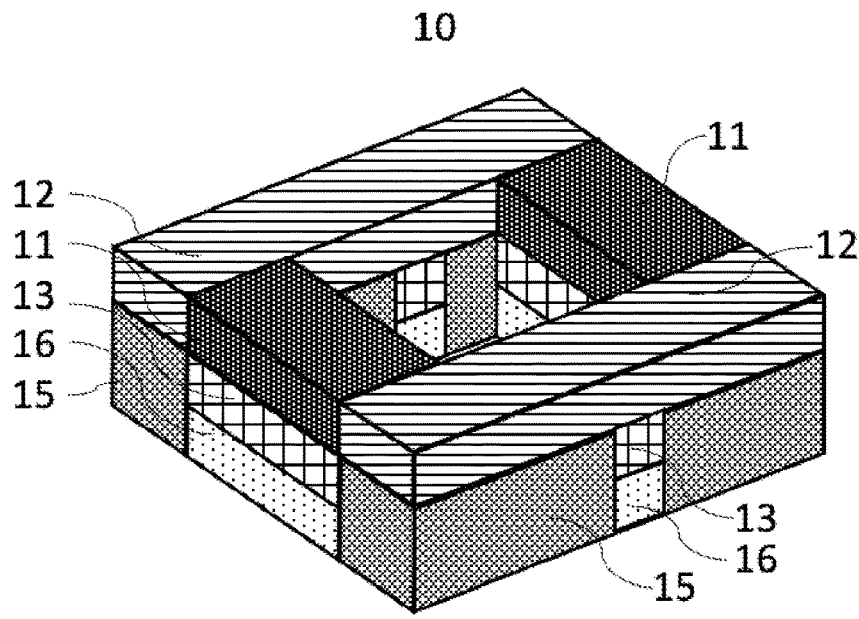
FIG. 1 is a structure diagram of the magnetic sensor in Example 1 according to the present invention.

Wherein, 10—magnetic sensor, 11—piezomagnetic component, 12—magnetostrictive component, 13—piezoelectric component, 14—magnetic conductor element, 15—insulating element, 16—conducting element.

DETAILED DESCRIPTION OF SOME EMBODIMENTS

The advantages of the present invention are further described below in combination with the drawings and specific embodiments.

Exemplary examples will be described herein in detail, and the typical example thereof presents in the drawings. When the following description refers to the drawings, unless otherwise indicated, the same numbers in different drawings indicate the same or similar elements. The embodiments described in the following exemplary examples do not represent all embodiments consistent with the present disclosure. On the contrary, they are merely examples of the device and the method consistent with some aspects of the present disclosure as detailed in the appended claims.

The terms used in the present disclosure are only for the purpose of describing specific examples, not intended to limit the present disclosure. The singular of "a", "said" and "the" used in the present disclosure and appended claims is also intended to include plural, unless other meanings mentioned above and below are clearly indicated. It should also be understood that the term "and/or" used herein refers to any or all possible combinations incorporating one or more associated listed items.

It should be understood that although the terms such as first, second, third and the like may be used in the present disclosure to describe various information, these information should not be limited to these terms. These terms are only used to distinguish identical kinds of information from each other. For example, within the present disclosure, a first information may also be referred to as a second information, similarly, a second information may also be referred to as a first information. According to the context, the word "if" as used herein can be interpreted as "when" or "in the case that" or "depending on".

In the description of the present invention, it should be understood that the terms such as "longitudinal", "transverse", "upper", "lower", "front", "rear", "left", "right", "vertical", "horizontal", "top", "bottom", "inner", "outer" and the like indicating orientational or positional relations are based on the orientational or positional relations shown in the drawings, only for the convenience of describing the present invention and simplifying the description, instead of indicating or implying that the pointed device or element must have a specific orientation, and be arranged and operated in a specific orientation, therefore they cannot be understood as limitations imposed on the present invention.

In the description of the present invention, unless otherwise specified and limited, it should be noted that the terms "installation", "connection", and "join" should be understood in a broad sense, for example, they can be mechanical connection or electrical connection, or internal connection between two elements, or direct connection or indirect connection through an intermediate medium. For a person skilled in the art, the specific meaning of the above-mentioned terms can be understood according to specific circumstances.

In the following description, the suffixes such as "module", "part" or "unit" used to indicate elements are only for the convenience of describing the present invention, and have no specific meaning in themselves. Therefore, "modules" and "parts" can be commingled for use.

In the preset invention, the magnetic material with high-magnetoconductivity capable of gathering the flux lines and amplify the measurement field $H_{DC}$ is achieved by combining the use of piezomagnetic material, piezoelectric material and magnetostrictive material, so as to have the capability to be converted into lattice distortion by using the magnetostrictive material, in addition, the piezoelectric material adjacent to the magnetostrictive material is used to convert the lattice distortion into the electric potential difference between two contactors, so as to detect low-intensity magnetic fields without using a coil and generating an offset field.

Specifically, the magnetic sensor detecting the measured magnetic field $H_{DC}$ includes a piezomagnetic component, a magnetostrictive component, and a piezoelectric component. In the case of arranging the above materials, the piezomagnetic component includes a first piezomagnetic element and a second piezomagnetic element that are arranged opposite to each other, that is, the first piezomagnetic element and the second piezomagnetic element are facing each other, preferably arranged parallelly and have the same size.

The magnetostrictive component includes a first magnetostrictive element and a second magnetostrictive element that are arranged opposite to each other on the same side or normal side of the first piezomagnetic element and the second piezomagnetic element, respectively. Similarly, the first magnetostrictive element and the second magnetostrictive element are facing each other, preferably arranged parallelly and have the same size. In relation to the piezomagnetic component, the same side means that the first piezomagnetic element and the first magnetostrictive element are positioned on the same side of the magnetic sensor, and the second piezomagnetic element and the second magnetostrictive element are positioned on the same side of the magnetic sensor, while the normal side means that the first magnetostrictive element and the second magnetostrictive element are positioned between the first piezomagnetic element and the second piezomagnetic element, forming a rectangular magnetic circuit together.

The piezoelectric component includes a first piezoelectric element deposited underneath the first piezomagnetic element, a second piezoelectric element deposited underneath the second piezomagnetic element, a third piezoelectric element deposited underneath the first magnetostrictive element, and a fourth piezoelectric element deposited underneath the second magnetostrictive element.

Provided with the above structure, the first piezoelectric element and the second piezoelectric element are electrically connected to a power supply circuit, and produce first deformation after being powered on as a result of the characteristics of the piezoelectric material, thus the first deformation will cause the first piezoelectric element and the second piezoelectric element to press the first piezomagnetic element and the second piezomagnetic element, respectively, so the first piezomagnetic element and the second piezomagnetic element generate an alternating magnetic field $H_{AC}$ after being subject to the pressure, making use of the characteristics of the piezomagnetic material. In this case, in addition to being in the environment of the measured magnetic field $H_{DC}$, the magnetic sensor also has the alternating magnetic field $H_{AC}$ in itself, which is stacked to the measured magnetic field $H_{DC}$ to form the magnetic circuit, in which the first magnetostrictive element makes use of its own material characteristics to form second deformation, and in which the second magnetostrictive element forms third deformation. It is understandable that after the loop of the alternating magnetic field $H_{AC}$ has been stacked to the single field direction of the measured magnetic field $H_{DC}$, the resultant magnetic fields acting on the first magnetostrictive element and the second magnetostrictive element are different in intensity (adding in the same direction pertains to the first magnetostrictive element, while subtracting in the reverse direction pertains to the second magnetostrictive element, or vice versa), so that the second deformation produced on the first magnetostrictive element is also different form the third deformation produced on the second magnetostrictive element.

Therefore, in the case of different deformation amounts, a first electric potential and a second electric potential different from each other are formed on the third piezoelectric element and the fourth piezoelectric element, respectively. Preferably, the magnetic sensor can calculate the magnetic field intensity of the measured magnetic field $H_{DC}$ within one or more cycles based on the electric potential difference between the first electric potential and the second electric potential, finally get the magnetic field intensity of the measured magnetic field $H_{DC}$ according to the relation between the electric potential difference and the magnetic field intensity of the measured magnetic field $H_{DC}$.

Through the above configuration, on the one hand, the use requiring coils is eliminated, on the other hand, the detection dimension is transferred from the magnetic field intensity to the voltage strength by collecting the electric potential difference between the first electric potential and the second electric potential, thereby having the capability to enlarge the detection range of low magnetic field intensity and expand the usage scenarios. Furthermore, it can be understood that comparing the readings from two components in multiple $H_{AC}$ cycles can achieve the effect of suppressing noise and improving sensitivity.

The structural design of the magnetic sensor will be described in detail in different examples as follows.

Example 1

Figure 2:
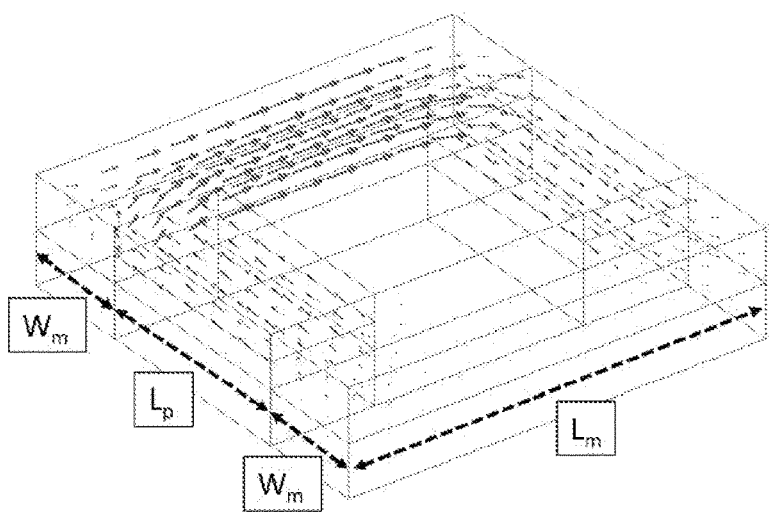
FIG. 2 is a schematic diagram of the magnetic circuit of the magnetic sensor in Example 1 according to the present invention.

FIGS. 1-5 show the structure, working principle, and magnification of the magnetic sensor 10 of Example 1, respectively. In this example, the first magnetostrictive element and the second magnetostrictive element are arranged on the normal side of the first piezomagnetic element and the second piezomagnetic element, respectively, and the first magnetostrictive element, the second magnetostrictive element, the first piezomagnetic element and the second piezomagnetic element are arranged on the identical horizontal layer, thereby forming the rectangular magnetic induction layer, which has the length and width consistent with each other (as shown in FIG. 2), that is, during detailed design, we can set the length of the first magnetostrictive element and the second magnetostrictive element as $L_m$, the width of them as $W_m$, and the length of the first piezomagnetic element and the second piezomagnetic element as $L_p$, so as to attain $L_m = L_p + 2W_m$.

It can be understood that $L_m$ among the sizes within the magnetic sensor 10 in this example may range from 1 nm to 1 cm.

FIG. 2 shows the arrow diagram of the magnetic field in the sensor in the case that one side of the loop of the alternating magnetic field $H_{AC}$ is fully compensated by the measured magnetic field $H_{DC}$. The two magnetic fields ($H_{AC}$ and $H_{DC}$) are added to each other on the other side of the loop, so the two magnetostrictive elements have the largest difference. The induced magnetization in the piezomagnetic component 11 is perpendicular to the $H_{DC}$ and opposite to each other on each side. It can be understood that high magnetoconductivity is beneficial to the magnetostrictive component 12. As long as the magnetoconductivity is high enough, a lower $H_{DC}$ can have been detected by increasing the $L_m/W_m$ ratio.

Figure 3:
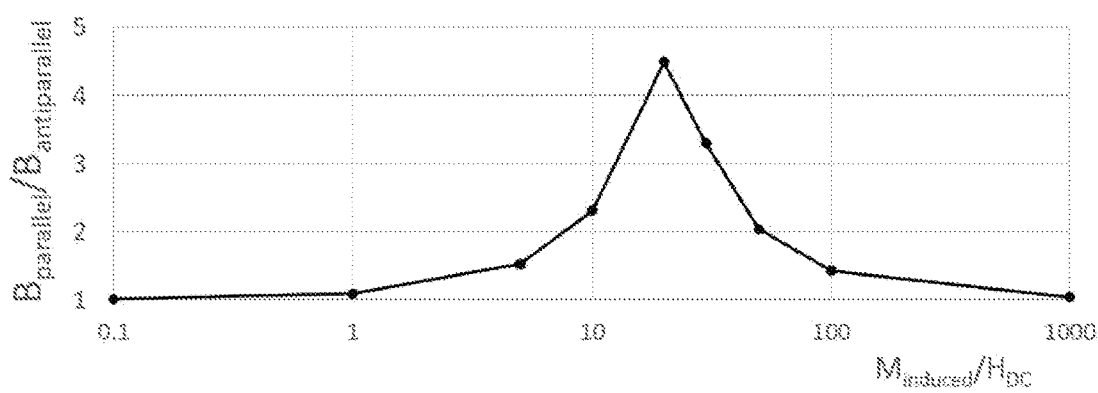
FIG. 3 is a schematic diagram of the magnification of the measured magnetic field $H_{DC}$ and the alternating magnetic field $H_{AC}$ relative to the measured magnetic field $H_{DC}$ in different magnetic field intensity in Example 1 according to the present invention.
Figure 4A:
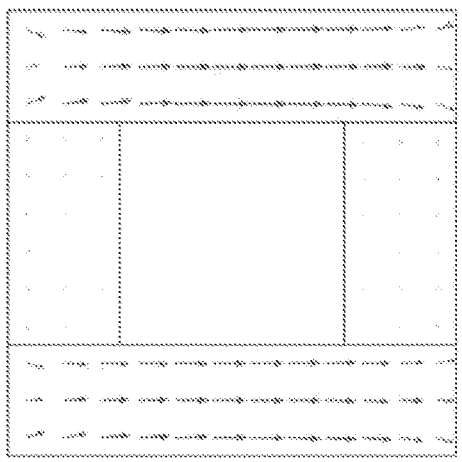
FIG. 4a is a schematic diagram of the magnetic circuit of the magnetic sensor controlled by the measured magnetic field $H_{DC}$, in Example 1 according to the present invention.
Figure 4B:
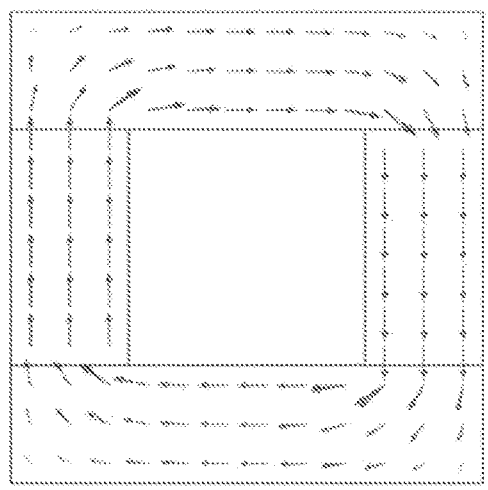
FIG. 4b is a schematic diagram of the magnetic circuit of the magnetic sensor controlled by the measured magnetic field $H_{DC}$, in Example 1 according to the present invention.
Figure 4C:
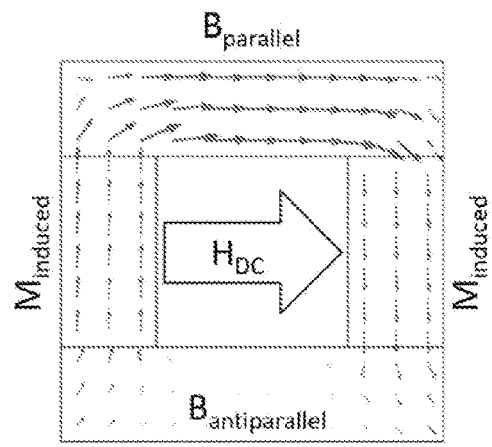
FIG. 4c is a schematic diagram of the magnetic circuit of the magnetic sensor under the circumstance in the maximum sensitivity, in Example 1 according to the present invention.

Refer to FIG. 3, where $H_{AC} = \mu_0 M_{induced}$, that is, $M_{induced}$ represents the effect of the alternating magnetic field $H_{AC}$ on the magnetic sensor 10. In Example 1, the piezomagnetic component 11 has induced $H_{AC}$ in the magnetostrictive component 12 of the loop, and controls the direction of the magnetic flux lines in the magnetic circuit. The direction of $M_{induced}$ will change with the compressive or tensile strain applied by the nether piezoelectric component 13 during a magnetic field cycle.

The magnetostrictive component 12 with high magnetoconductivity gathers the magnetic flux lines and converts the magnetic field into deformation, wherein volume magnetostriction is not sensitive to the direction of the magnetic field. Therefore, when the total magnetic field $B_{antiparallel}$ in the first magnetostrictive element disappears, the maximum signal can be obtained. Due to the high magnetoconductivity of the magnetostrictive component, such circumstances will occur in the case that $M_{induced}$ (and later $B_{parallel}$) is much higher than the measured magnetic field $H_{DC}$, so it is easier to have detected the resultant magnetostrictive strain. The piezoelectric component 13 generates strain to induce magnetization and convert the magnetostrictive deformation into a readable voltage. The electroconductive magnetic top layer provides a shared earthing contact used to control the first piezoelectric element and the second piezoelectric element, and underneath the first piezoelectric element and the second piezoelectric element, a separate bottom contact can be provided.

FIG. 3 shows the magnetic field ratio of the magnetostrictive side of the loop to the total magnetic. The position of the peak indicates that the sensor with this specific length amplifies the input signal by approximately 20 times. If the magnetic field intensity of the measured magnetic field $H_{DC}$ is so low that the $B_{parallel}$ at the maximum sensitivity is still too small to induce a measurable magnetostrictive strain, a larger magnetization has to be induced in the first piezomagnetic element and the second piezomagnetic element to enter the state of FIG. 4b, thus, the ratio Norm ($B_{parallel}/B_{antiparallel}$) decreases, but the Norm ($B_{parallel}$) becomes high enough to be detected through magnetostrictive strain and piezoelectric voltage. In the measurement process with alternating magnetic field $H_{AC}$, the components functioning as $B_{parallel}$ and $B_{antiparallel}$ switches can reduce thermal noise or magnetic noise. In this example, the reading mechanism of the magnetic field intensity is different from that of the fluxgate magnetometer, in which both sides of a magnetic core pass through a single reading coil, but two separate first and second magnetostrictive elements here are used for reading, and the deformation is converted into voltage by two separate third and fourth piezoelectric elements. In the presence of $H_{DC}$, the voltage readings in the two piezoelectric elements are different and the difference is proportional to $H_{DC}$.

Figure 5:
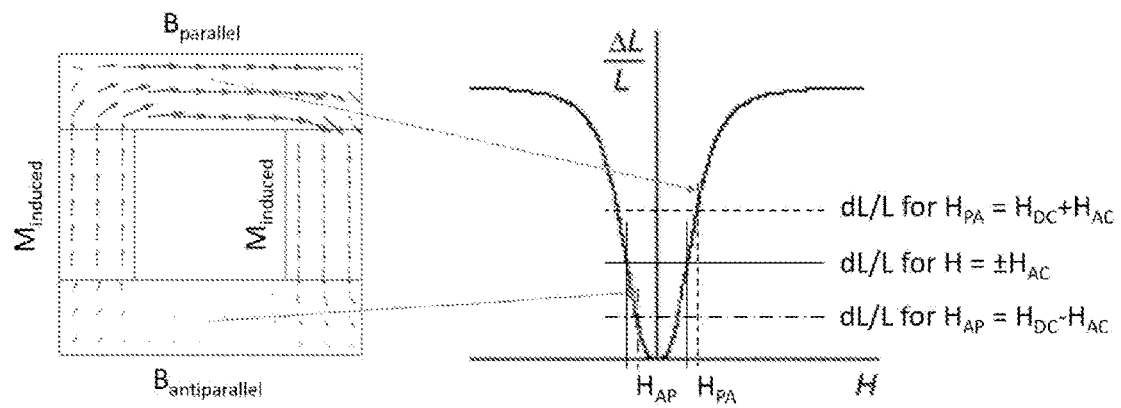
FIG. 5 is a schematic diagram of the relation between the magnetostriction undergone by the first magnetostrictive element and the second magnetostrictive element within the magnetic sensor in Example 1 according to the present invention, and the magnetic field.
Figure 6:
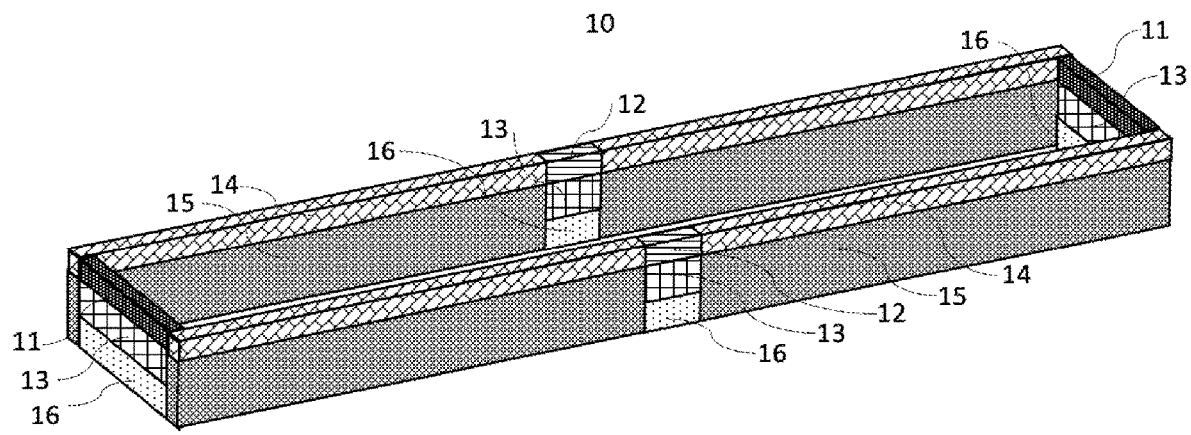
FIG. 6 is a structure diagram of the magnetic sensor in Example 2 according to the present invention.

FIG. 5 illustrates the utilization of the non-linear dependence of magnetostriction (deformation) on the magnetic field. If there is no measured magnetic field $H_{DC}$, both the first magnetostrictive element and the second magnetostrictive element will undergo the same field $H_{AC}$ induced by the piezomagnetic element, therefor, resultant lattice distortion is the same, so is positive and negative signs (an H's even function), giving rise to the same voltage readings in the two magnetostrictive elements. In the presence of a limited uniform external magnetic field $H_{DC}$, the alternating magnetic field $H_{AC}$ is added to or subtracted from $H_{DC}$, which causes the difference in deformation of the two magnetostrictive elements. This difference will be maximized when $H_{AC}$ approaches the steepest slope of magnetostriction and magnetic field (between zero and saturation).

Therefore, $H_{AC}$ performs a deviating function. When $H_{AP}$ ($B_{antiparallel}$) disappears, the maximum sensitivity will be reached. However, such compensation to low $H_{DC}$, $H_{AC}$ and $H_{DC}$ may cause that $H_{AC}$ is not enough to reach the steepest slope, then presents the state of the magnetic circuit in FIG. 4b. On the other hand, if the $H_{DC}$ is too high to be compensated by $H_{AC}$ (for example, when reaching the material upper limit of the piezomagnetic component 11), the magnetostriction in the two magnetostrictive elements may reach saturation, and no signal can be detected at all. If a coil with a ferromagnetic (FM) core is used to replace the piezomagnetic component 11, such limitation range can be eliminated. The magnetostrictive materials with low/high magnetic susceptibility, such as Terfenol-D/Metglass, are suitable for detecting high/low $H_{DC}$. In the example focusing on the detection of low magnetic fields, although the saturation magnetostriction coefficient is much lower, Metglass is still preferably used.

Example 2

In order to further increase the magnification of the measured magnetic field $H_{DC}$, thereby making the sensor have sensitivity covering a lower magnetic field, $L_m$ can be increased, while $L_p$ and $W_m$ can be decreased. Specifically, FIGS. 6-9 are schematic diagrams of the structure and magnification of the magnetic sensor 10 in Example 2, respectively, where as same as Example 1, the first magnetostrictive element and the second magnetostrictive element are arranged on the normal side of the first piezomagnetic element and the second piezomagnetic element, respectively, and the first magnetostrictive element, the second magnetostrictive element, the first piezomagnetic element and the second piezomagnetic element are arranged on the identical horizontal layer, thereby forming a rectangular magnetic induction layer, in addition, the magnetic conductor element 14, which is preferably made of high-magnetoconductivity material (with low or negligible magnetostriction), is arranged on the both ends of the first magnetostrictive element and the second magnetostrictive element, and used to increase the magnetic field magnification on the side of the magnetostrictive component 12, which is made of magnetostrictive material (preferably with high magnetoconductivity).

The magnetic conductor element 14 acting as an extended side, allows the measured magnetic field $H_{DC}$ to be coupled to the magnetostrictive component 12 to the maximum extent, and achieves the maximum amplification, so that even for the $H_{DC}$ of only 10 pT, the steepest slope of magnetostriction can also be achieved within the magnetostrictive component 12. Then, the difference between the magnetostrictive deformation in the first magnetostrictive element and that in the second magnetostrictive element is maximized and can have been easily detected by the piezoelectric component 13 underneath them. The advantage of this example is that the piezoelectric component 13 does not need to be deposited along the entire sensor, but only underneath the piezomagnetic component 11 and the magnetostrictive component 12.

Figure 7:
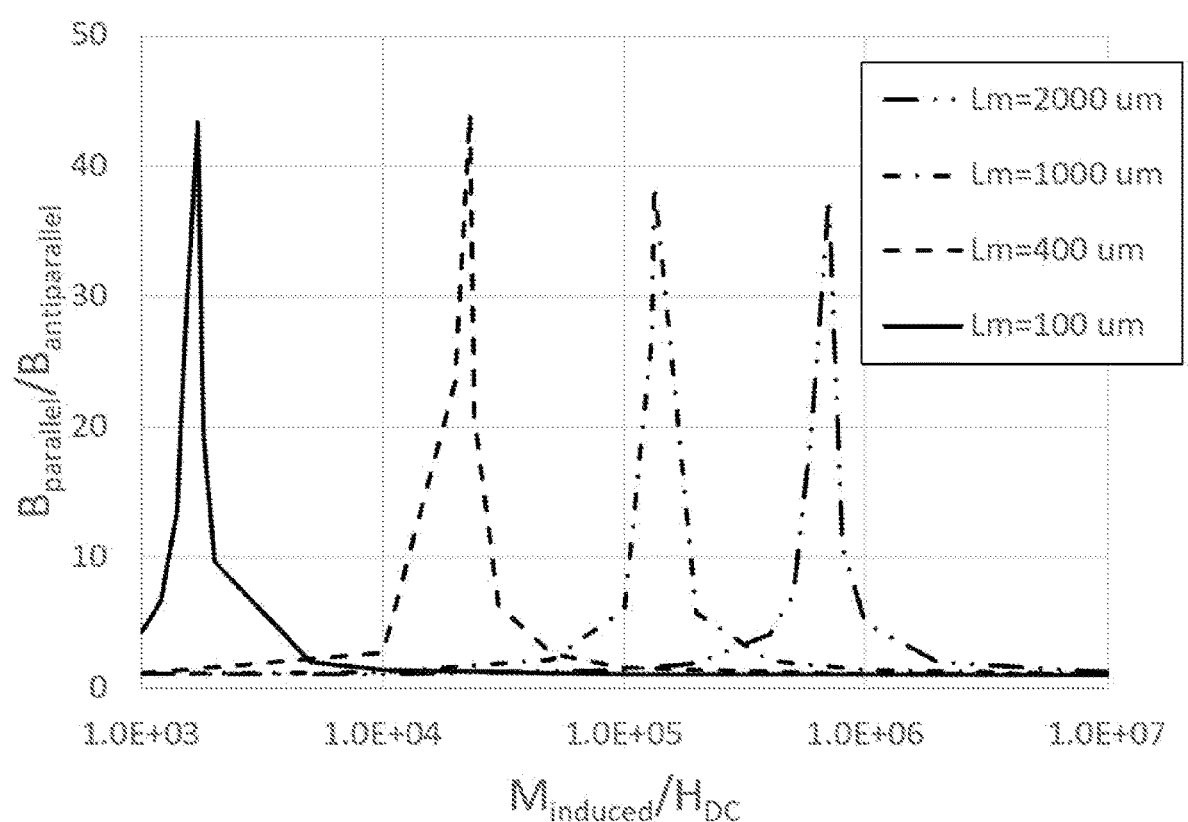
FIG. 7 is a schematic diagram of the magnification of the measured magnetic field $H_{DC}$ and the alternating magnetic field $H_{AC}$ relative to the measured magnetic field $H_{DC}$ in different magnetic field intensity, within the magnetic sensor with different length-width ratios in Example 2 according to the present invention.

FIG. 7 shows how the magnification increases from about 20 times in Example 1 to nearly $10^6$ in Example 2 as the length $L_m$ gradually increases to 2 mm while maintaining $W_m=1$ μm. The length $L_p$ of the first piezomagnetic element and the second piezomagnetic element is not directly interrelated to the magnification, and preferably, it can be maintained at 8 μm.

It is vital that coupling $H_{DC}$ into the magnetic conductor element 14 requires a high magnetoconductivity, and the maximum ratio $L_m/W_m=2000$ is limited to the maximum available magnetoconductivity of approximately $10^6$ (within Metglass 2714A having low magnetostriction).

Figure 8:
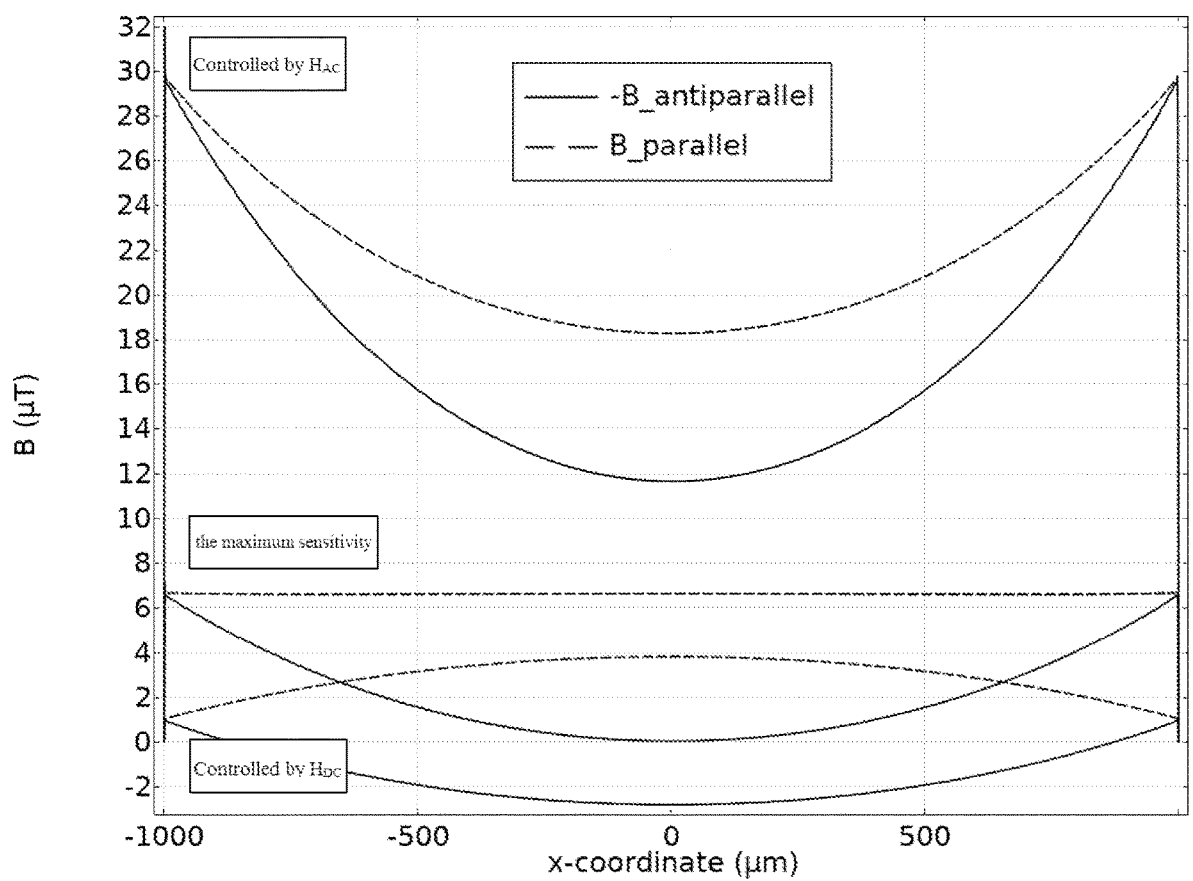
FIG. 8 is a schematic diagram of the relation between the magnetic fields undergone by the magnetic conductor element in the length direction under the control of different magnetic fields, within the magnetic sensor in Example 2 according to the present invention.

FIG. 8 shows the total magnetic field $B_{parallel}$ and $B_{antiparallel}$ along the magnetic conductor element 14. The magnetic field is along the long side of the $H_{DC}$ and the magnetic sensor 10. Each of the three states in FIG. 8 includes a pair of curves, in which contrary to Example 1, the field has a big (parabolic curve) fluctuation along the element. The midpoint of the first magnetostrictive element and the second magnetostrictive element is positioned at the middle of a conducting wire, so the corresponding magnetic field intensity presents at x=0 in the figure. In the maximum sensitivity interval, there is $B_{antiparallel}=0$ when x=0. In the case of $H_{DC}$'s dominance, the directions of $B_{antiparallel}$ and $B_{parallel}$ are the same as when x=0 in Example 1. In the case of $H_{AC}$'s dominance, $B_{antiparallel}$ and $B_{parallel}$ have directions opposite to each other, and the magnetization intensity in the middle of the first magnetostrictive element and the second magnetostrictive element decreases. This decrease in magnetization intensity is not beneficial to the reading mechanism (magnetostrictive response), and if both the magnetostrictive component 12 and the magnetic conductor element 14 make use of materials with high magnetoconductivity, the extent of this decrease in magnetization intensity will be reduced.

Figure 9:
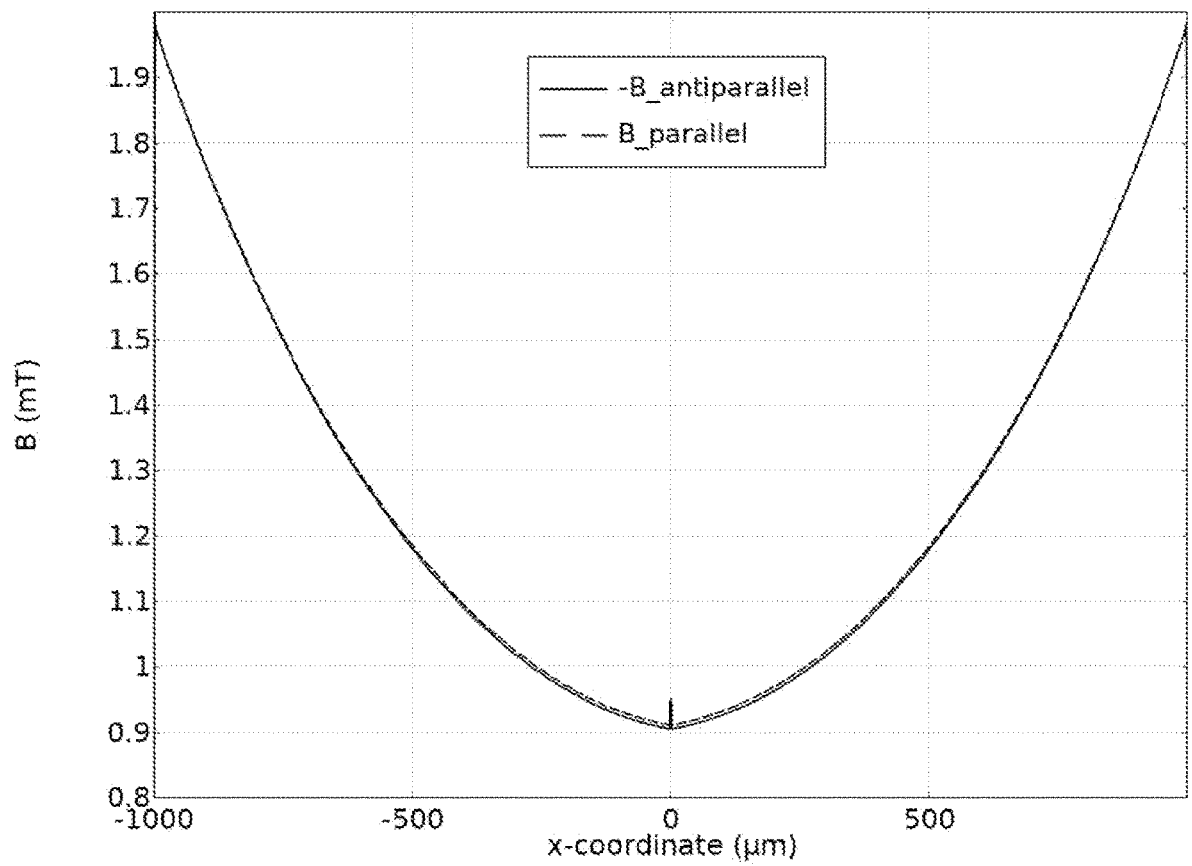
FIG. 9 is a schematic diagram of magnetic field distribution when the magnetostrictive element within the magnetic sensor of Example 2 according to the present invention reaches a magnetic field of ~1 mT.

FIG. 9 shows the magnetic field distribution at the time of $M_{induced}$ increasing to 20 Oe to achieve the magnetic field intensity of ~1 mT in the magnetostrictive component 12, with the magnetic field enough to bias and the detectable voltage (approximately 100 nV) induced on the adjacent piezoelectric component 13. Thus, the ratio of $B_{parallel}/B_{antiparallel}$ drops sharply to ~1.01, so the voltage difference measured on both sides is about 1%. Collecting data in a large number of cycles of the alternating magnetic field $H_{AC}$ helps to keep noise below the signal level in this interval, and meanwhile amplify the signal.

Example 3

Figure 10:
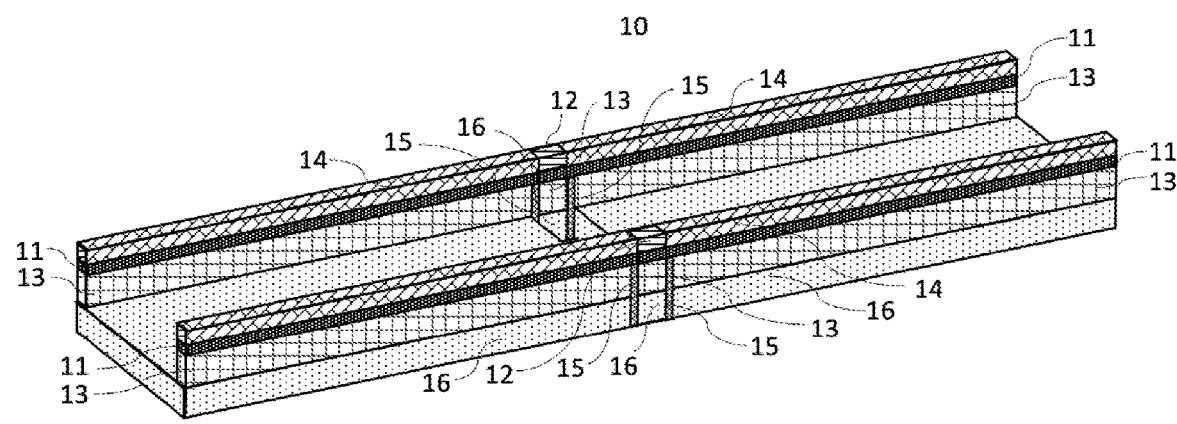
FIG. 10 is a structure diagram of the magnetic sensor in Example 3 according to the present invention.
Figure 11:
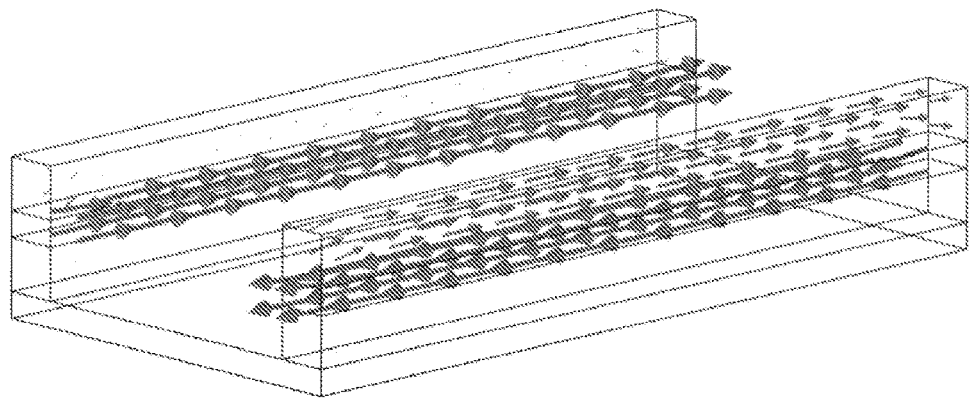
FIG. 11 is a schematic diagram of the magnetic circuit of the magnetic sensor in Example 3 according to the present invention.
Figure 12:
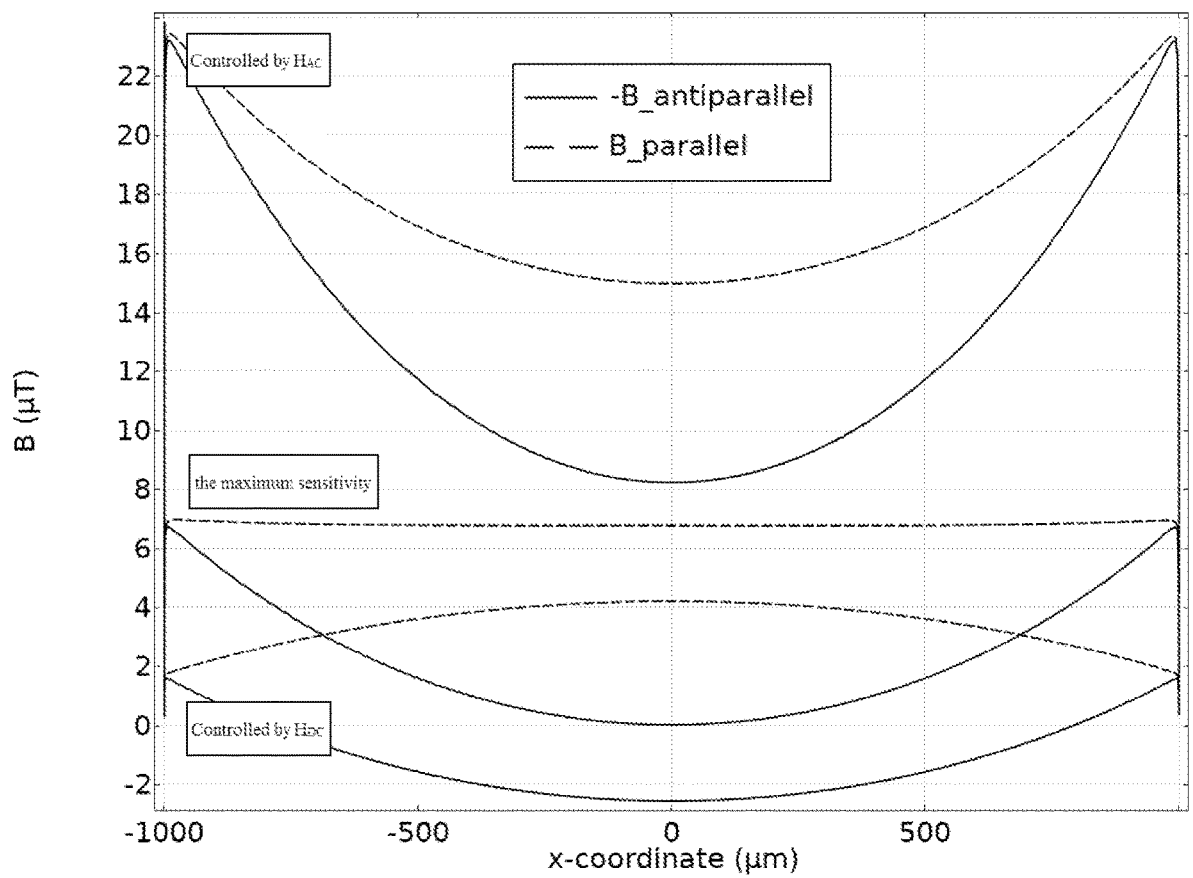
FIG. 12 is a schematic diagram of the relation between the magnetic fields undergone by the magnetic conductor element in the length direction under the control of different magnetic fields, within the magnetic sensor in Example 3 according to the present invention.
Figure 13:
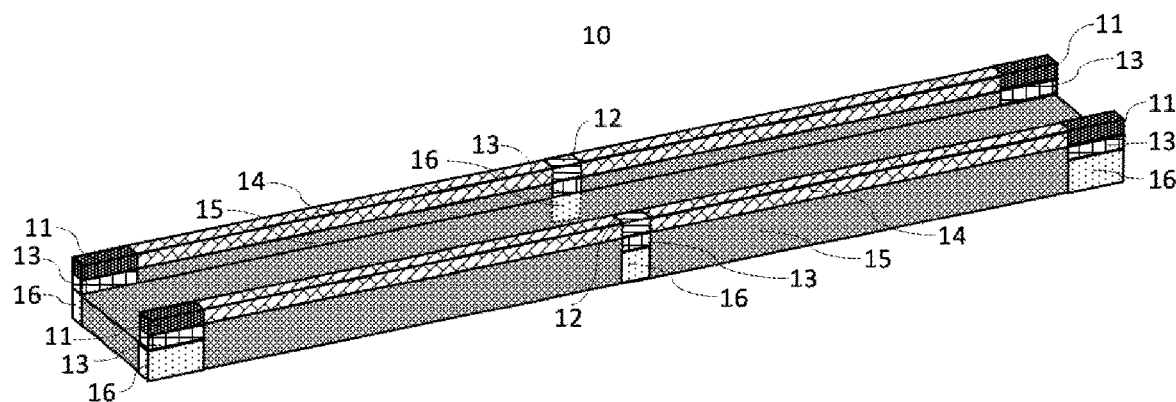
FIG. 13 is a structure diagram of the magnetic sensor in Example 4 according to the present invention.
Figure 14:
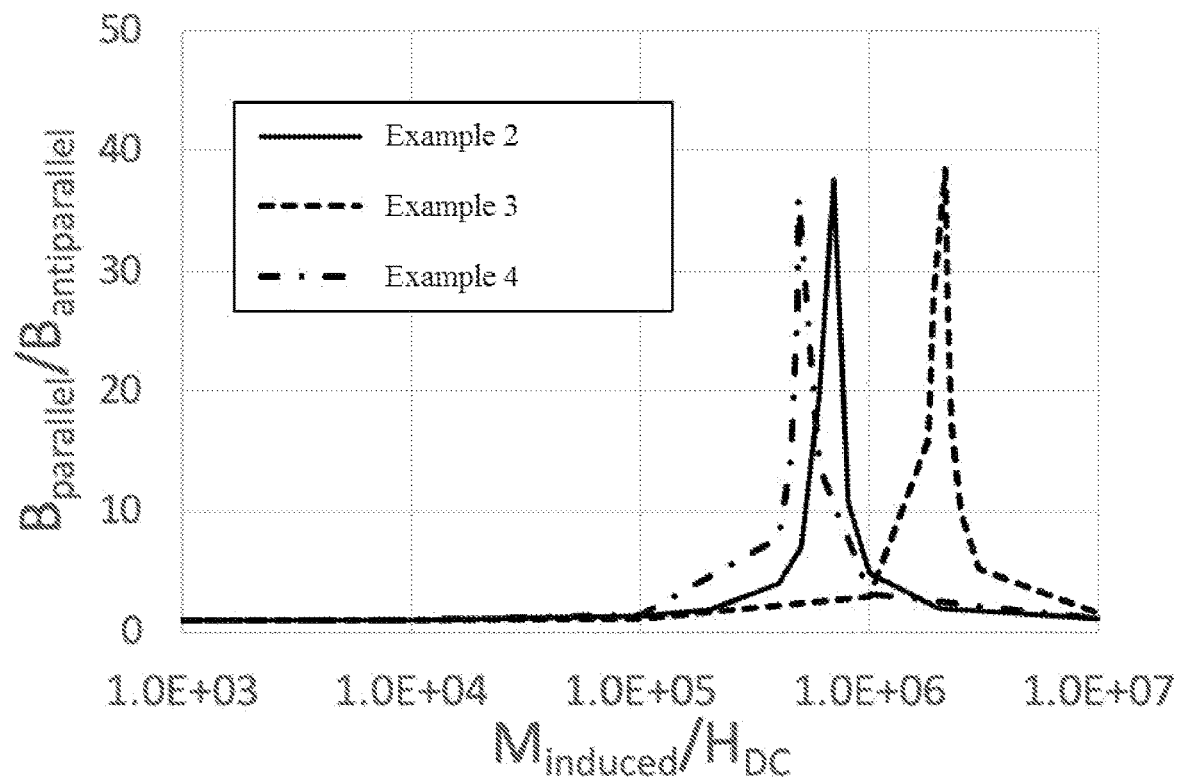
FIG. 14 is a schematic diagram of the expected magnifications of Example 2, Example 3, and Example 4.
Figure 15:
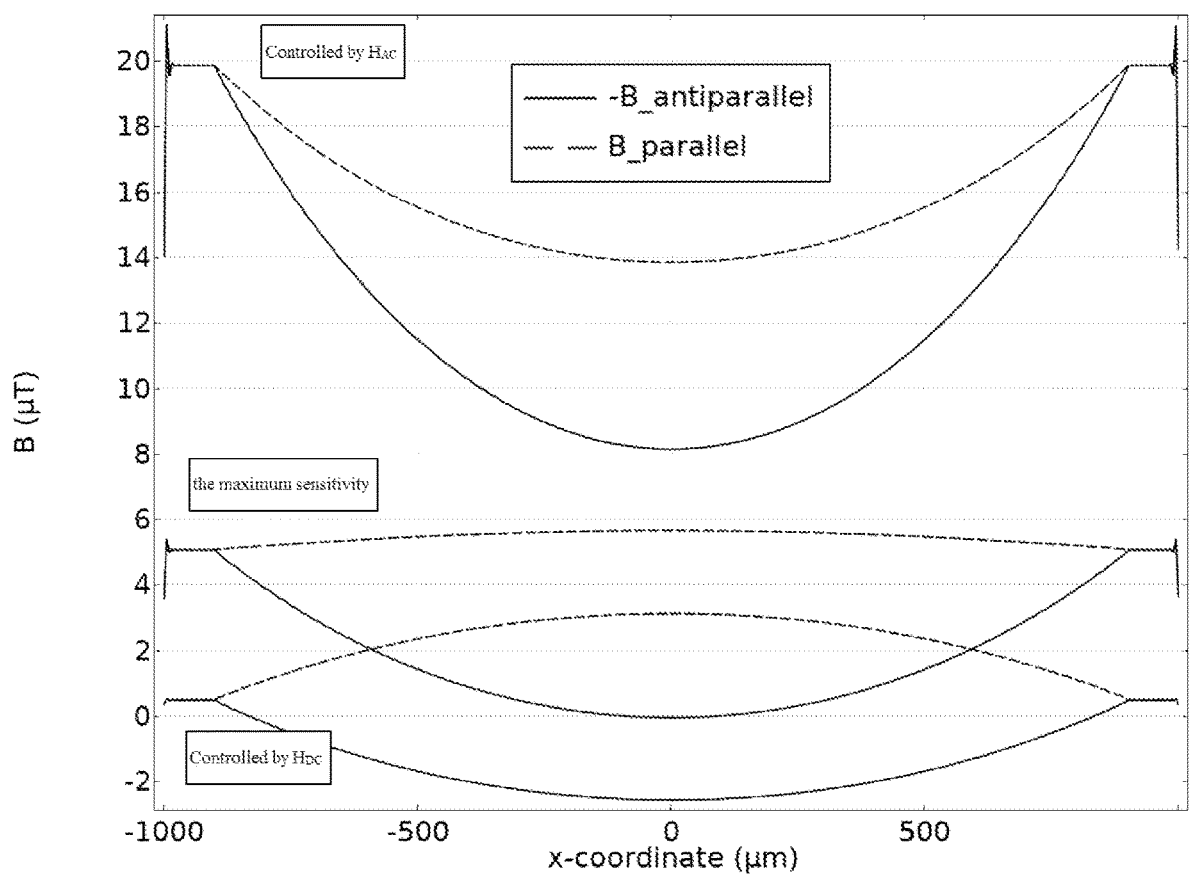
FIG. 15 is a schematic diagram of the relation between the magnetic fields undergone by the magnetic conductor element in the length direction under the control of different magnetic fields, within the magnetic sensor in Example 4 according to the present invention.
Figure 16:
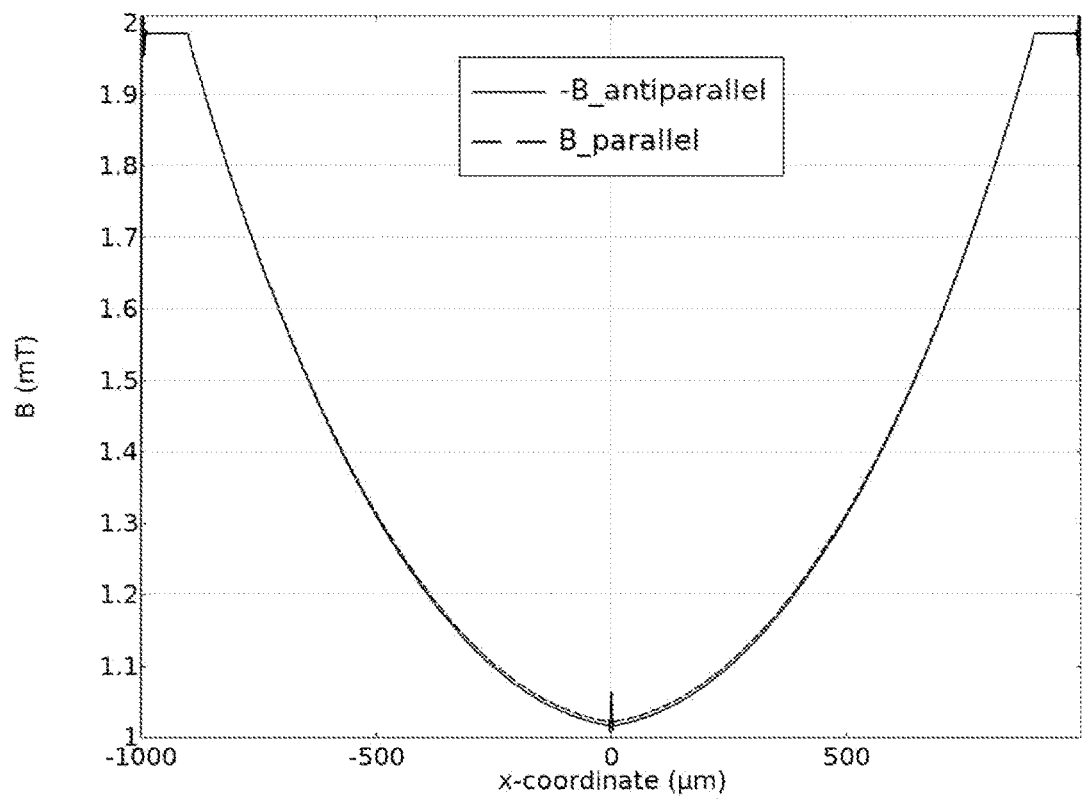
FIG. 16 is a schematic diagram of magnetic field distribution when the magnetostrictive element within the magnetic sensor of Example 4 according to the present invention reaches a magnetic field of ~1 mT.

FIGS. 10-12 are schematic diagrams of the structure and magnification of the magnetic sensor 10 in Example 3, respectively, where the highest magnification of the measured magnetic field $H_{DC}$ and the simplification of the structure have been achieved. Specifically, the first magnetostrictive element and the second magnetostrictive element are arranged on the same side of the first piezomagnetic element and the second piezomagnetic element, respectively, and the first magnetostrictive element is arranged on the first piezomagnetic element and the second magnetostrictive element is arranged on the second piezomagnetic element, to form a magnetic induction strip. Compared with Examples 1 and 2 described above, the magnetic circuit is replaced by two "vertical" magnetic circuits, and the circuit has its bottom composed of the piezomagnetic component 11, and the induced magnetization intensity controlled by the piezoelectric component 13 underneath it. The magnetostrictive element 12 and the piezoelectric element 13 with a length of 2 to 10 μm positioned at the middle of each conducting wire are used for reading on both sides. The significant advantage of this example over Examples 1 and 2 is that the two sides of the magnetic sensor 10 are in a separate state, so each side can be replaced by a plurality of stacked layers with the same alternating magnetic field $H_{AC}$, so as to suppress noise and improve the sensitivity of the sensor in low magnetic field intensity.

Example 4

FIGS. 13-17 are schematic diagrams of the structure, the magnification and the sensor array of the magnetic sensor 10 in Example 4, respectively, where a further enhancement on the basis of Example 4 is realized. Specifically, the first magnetostrictive element and the second magnetostrictive element are arranged on the same side of the first piezomagnetic element and the second piezomagnetic element, respectively, and the first magnetostrictive element is arranged beside the both ends of the first piezomagnetic element and the second magnetostrictive element is arranged beside the both ends of the second piezomagnetic element, to form a magnetic induction strip. In this example, the piezomagnetic component 11 is moved to the terminal ends of the two magnetic sensors 10, and the length of the piezomagnetic component 11 ranges between 1-20% of the total length $L_m$. Preferably, these elements have the same thickness and width with those of the magnetostrictive elements, but not limited thereto. As the closed magnetic circuit as in the forementioned example is not formed, Example 4 does not pertain to a variation of a flux gate magnetometer.

Figure 17:
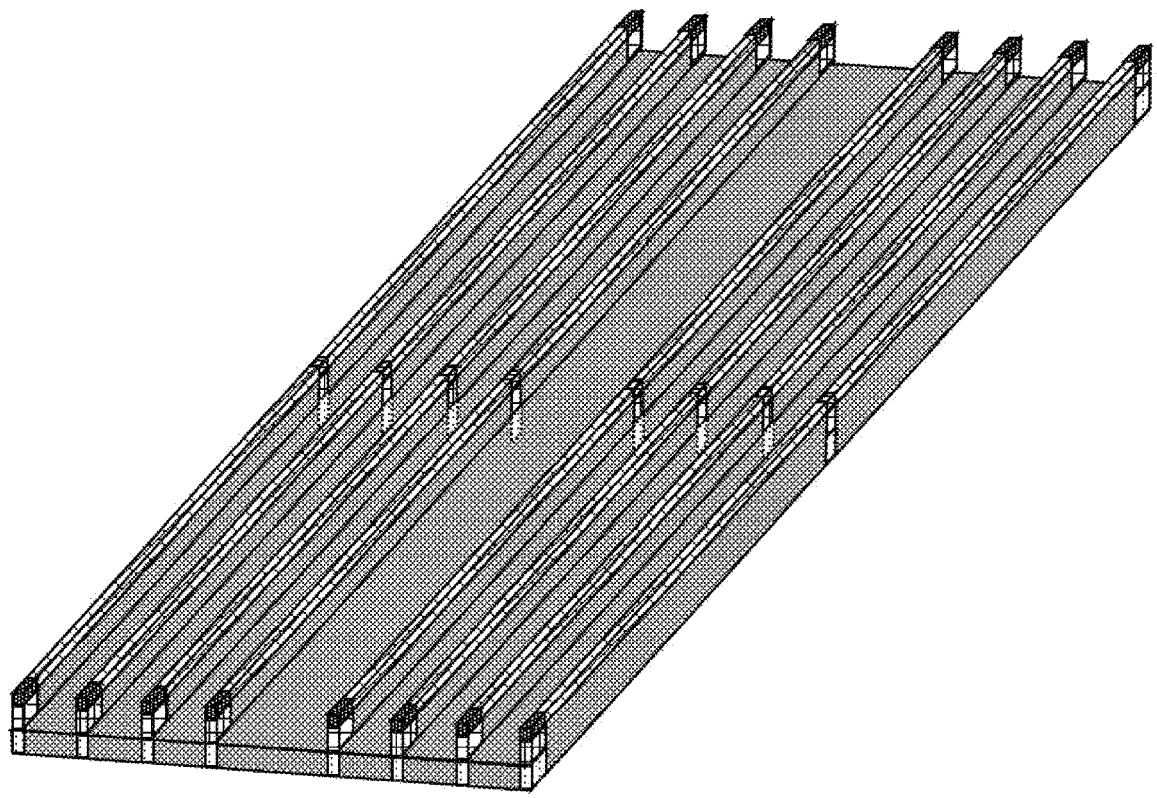
FIG. 17 is a structure diagram of the sensor array formed by the magnetic sensor of Example 4 according to the present invention.

As in Examples 2 and 3, the magnetic conductor element 14 is used to guide the field lines to the detected element in the middle of the two parallel strips. In this example, the number of the stacked layers is only two instead of three, so the magnetostrictive element 12 for reading is directly positioned on top of the piezoelectric element 13, which improves the mechanical coupling of the two layers and can better transmit strain. As in Examples 2 and 3, these reading elements have a length of 2 to 10 μm. As in Examples 2 and 3, the two sides are separated from each other, so each side can be replaced by a plurality of stacked layers with the same alternating magnetic field $H_{AC}$, so as to suppress noise and improve the sensitivity of the sensor in low magnetic field intensity. And as shown in FIG. 17, this example is allowed to create the sensor array by eliminating the short side of the circuit, and each magnetic induction strip is distributed in parallel, with capability to be freely stacked according to user's needs. In this example, each magnetic induction strip of the sensor array can have identical sizes, or different sizes which correspond to different sensitivity. In case of the same size, the sensitivity is the same, but only the signal-to-noise ratio of the measured magnetic field is amplified.

Such a magnetic conductor element is possibly provided in any of the above examples. When the magnetic sensor has a rectangular magnetic induction layer, the magnetic conductor element extends to be connected to both ends of the first piezomagnetic element and the second piezomagnetic element, so as to maintain the rectangular magnetic induction layer. When the magnetic sensor has a magnetic induction strip, the magnetic conductor element extends to be connected to the two ends of the first piezomagnetic element and the second piezomagnetic element, or extends to form the end of the magnetic sensor, so as to maintain a magnetic connection between the piezomagnetic component and the magnetostrictive component.

In any of the above examples, the magnetic conductor element is made of high-magnetoconductivity material with low or negligible magnetostriction, preferably made of a magnetic alloy including one or more of Fe, Co, Ni, Si, and B. It is understandable that the material with high magnetoconductivity gathers magnetic fields, thereby allowing more $H_{DC}$ to be coupled into a magnetic circuit and increasing the magnetic field amplification of a magnetic sensor. The gathered magnetic field must be large enough so that the magnetostriction of intermediate components depends on the applied magnetic field to the maximum extent.

Furthermore, in any of the above examples, the sensor further includes the insulating elements 15 alternately arranged between the first piezoelectric element, the second piezoelectric element, the third piezoelectric element, and the fourth piezoelectric element, so as to avoid the first piezoelectric element, the second piezoelectric element, the third piezoelectric element, and the fourth piezoelectric element from conducting electricity and interfering with each other; and the conducting element 16 deposited underneath the piezoelectric component 13. Preferably or optionally, the conducting element is made of one of Pt, Pd, Au, SrRuO$_3$ or Nb-doped SrTiO$_3$. In addition, other top metal contacts can be added as an earthing contact, preferably Pt and Au.

Preferably or optionally, the magnetostrictive component is made from any one of Fe-based amorphous (FeSiB), Galfenol alloy, FeCo or Terfenol-D. The piezomagnetic components is made from $Mn_{3-x}A_xB_{1-y}C_yN_{1-z}$ where A, B and C include one or more of Ag, Al, Au, Co, Cu, Fe, Ga, Ge, In, Ir, Ni, Pd, Pt, Rh, Sb, Si, Sn, Zn, or made from $Cr_{3-x}A_xSn_{1-y}B_yN_{1-z}$ where A and B include one or more of As, Ga, Ge, In, Sn, Mn, Ir, Pd, Pt, Rh. The piezoelectric component is made from any one of BaTiO$_3$, Pb(Zr$_x$Ti$_{1-x}$)O$_3$, (1-x)[Pb(Mg$_{1/3}$Nb$_{2/3}$)O$_3$]-x [PbTiO$_3$], AlN, ZnO, Li and/or Be-doped ZnO, Ba$_x$Sr$_{1-x}$TiO$_3$, BaZr$_x$Ti$_{1-x}$O$_3$, Bi$_4$Ti$_3$O$_{12}$ and LaWN$_3$.

It is understandable that the strain of the magnetostrictive component can range between 1 ppm and 2000 ppm. The magnetic conductor element has a magnetoconductivity of at least 1,000, but preferably 1,000,000. In Examples 1 and 2, the ratio of $L_m$ and $L_p$ is at least 1, preferably 10, and most preferably 100. The lattice mismatch between the piezomagnetic component and the piezoelectric component ranges between −1% and +1%.

The thickness of the piezoelectric component ranges between 1 nm and 2 μm. The length-to-width ratio of the magnetic sensor ranges between 1:1-1:2000. The magnetic sensors in Examples 2, 3 and 4 are orientated, thus have the highest sensitivity in the extension direction. Three separate magnetic sensors along three axes can be combined to achieve a millimeter-sized magnetic-field vector sensor. The length of the magnetostrictive component in Examples 2, 3 and 4 ranges from 2 to 10 μm. In any of the above examples, other top metal contacts can be added as an earthing contact, preferably Pt and Au.

It should be noted that the examples of the present invention which have better embodiments and do not impose any limitations on the present invention in any form, can possibly modified and changed to equivalent examples by any person skilled in the art using the technical content disclosed above, however, any modification or equivalent change and adjunct made to the above examples based on the technical essence of the present invention without departing from the content of the technical solution of the present invention still falls within the scope of the technical solution of the present invention.

What is claimed is:

1. A magnetic sensor used to detect a measured magnetic field $H_{DC}$, comprising:
   a piezomagnetic component,
   a magnetostrictive component, and
   a piezoelectric component,
   wherein said piezomagnetic component includes a first piezomagnetic element and a second piezomagnetic element that are arranged opposite to each other,
   said magnetostrictive component includes a first magnetostrictive element and a second magnetostrictive element that are arranged opposite to each other on the same side or normal side of said first piezomagnetic element and said second piezomagnetic element, respectively,
   said piezoelectric component includes a first piezoelectric element deposited underneath said first piezomagnetic element, a second piezoelectric element deposited underneath said second piezomagnetic element, a third piezoelectric element deposited underneath said first magnetostrictive element, and a fourth piezoelectric element deposited underneath said second magnetostrictive element;

wherein said first piezoelectric element and said second piezoelectric element are electrically connected to a power supply circuit, and produce first deformation, said first deformation is applied to said first piezomagnetic element and said second piezomagnetic element to produce an alternating magnetic field $H_{AC}$, said alternating magnetic field $H_{AC}$ is stacked to the measured magnetic field $H_{DC}$ to form a magnetic circuit, so that said first magnetostrictive element produces second deformation, and said second magnetostrictive element produces third deformation, said second deformation and said third deformation produce a first electric potential and a second electric potential on said third piezoelectric element and said fourth piezoelectric element, respectively, and said magnetic sensor calculates the magnetic field intensity of the measured magnetic field $H_{DC}$ based on said first electric potential and said second electric potential.

2. The magnetic sensor according to claim 1, wherein said first magnetostrictive element and said second magnetostrictive element are arranged on the normal side of said first piezomagnetic element and said second piezomagnetic element, respectively, to form a rectangular magnetic induction layer, said first magnetostrictive element, said second magnetostrictive element, said first piezomagnetic element and said second piezomagnetic element are arranged on an identical horizontal layer.

3. The magnetic sensor according to claim 2, wherein said magnetic sensor further includes a magnetic conductor element, said magnetic conductor element is arranged on the both ends of said first magnetostrictive element and said second magnetostrictive element to increase the magnetic field magnification on the side of said magnetostrictive component, when said magnetic sensor has a rectangular magnetic induction layer, said magnetic conductor element extends to be connected to both ends of said first piezomagnetic element and said second piezomagnetic element, so as to maintain the rectangular magnetic induction layer; when said magnetic sensor has a magnetic induction strip, said magnetic conductor element extends to be connected to the two ends of said first piezomagnetic element and said second piezomagnetic element, or extends to form the end of said magnetic sensor, so as to maintain a magnetic connection between said piezomagnetic component and said magnetostrictive component.

4. The magnetic sensor according to claim 3, wherein said magnetic conductor element is made of a magnetic alloy including one or more of Fe, Co, Ni, Si, and B, said magnetic conductor element has a magnetoconductivity of at least 1,000.

5. The magnetic sensor according to claim 1, wherein said first magnetostrictive element and said second magnetostrictive element are arranged on the same side of said first piezomagnetic element and said second piezomagnetic element, respectively, to form a magnetic induction strip, and said first magnetostrictive element is arranged on said first piezomagnetic element and said second magnetostrictive element is arranged on said second piezomagnetic element.

6. The magnetic sensor according to claim 1, wherein said first magnetostrictive element and said second magnetostrictive element are arranged on the same side of said first piezomagnetic element and said second piezomagnetic element, respectively, to form a magnetic induction strip, and said first magnetostrictive element is arranged beside the both ends of said first piezomagnetic element and said second magnetostrictive element is arranged beside the both ends of said second piezomagnetic element.

7. The magnetic sensor according to claim 6, wherein at least two magnetic induction strips are arranged side by side to form a sensor array, and each magnetic induction strip is distributed in parallel.

8. The magnetic sensor according to claim 1, wherein said magnetic sensor further includes an insulating element and a conducting element, said insulating elements are alternately arranged between said first piezoelectric element, said second piezoelectric element, said third piezoelectric element, and said fourth piezoelectric element, said conducting element is deposited underneath said piezoelectric component.

9. The magnetic sensor according to claim 1, wherein said magnetostrictive component is made from any one of Fe-based amorphous (FeSiB), Galfenol alloy, FeCo or Terfenol-D, said piezomagnetic components is made from $Mn_{3-x}A_xB_{1-y}C_yN_{1-z}$ where A, B and C include one or more of Ag, Al, Au, Co, Cu, Fe, Ga, Ge, In, Ir, Ni, Pd, Pt, Rh, Sb, Si, Sn, Zn, or made from $Cr_{3-x}A_xSn_{1-y}B_yN_{1-z}$ where A and B include one or more of As, Ga, Ge, In, Sn, Mn, Ir, Pd, Pt, Rh, said piezoelectric component is made from any one of $BaTiO_3$, $Pb(Zr_xTi_{1-x})O_3$, $(1-x)[Pb(Mg_{1/3}Nb_{2/3})O_3]$-x $[PbTiO_3]$, AlN, ZnO, Li and/or Be-doped ZnO, $Ba_xSr_{1-x}TiO_3$, $BaZr_xTi_{1-x}O_3$, $Bi_4Ti_3O_{12}$ and $LaWN_3$.

10. The magnetic sensor according to claim 1, wherein the lattice mismatch between said piezomagnetic component and said piezoelectric component ranges between −1% and +1%, the strain of said magnetostrictive component ranges between 1 ppm and 2000 ppm, the length-to-width ratio of said magnetic sensor ranges between 1:1-1:2000.

* * * * *